United States Patent [19]

Sato et al.

[11] Patent Number: 4,618,381

[45] Date of Patent: Oct. 21, 1986

[54] METHOD FOR ADDING IMPURITIES TO SEMICONDUCTOR BASE MATERIAL

[75] Inventors: Noritada Sato; Yasukazu Seki; Osamu Ishiwate, all of Kanagawa, Japan

[73] Assignees: Fuji Electric Corporate Research and Development Ltd.; Fuji Electric Company Ltd., both of Kanagawa, Japan

[21] Appl. No.: 613,778

[22] Filed: May 24, 1984

[30] Foreign Application Priority Data

May 26, 1983 [JP] Japan .................................. 58-93218
May 26, 1983 [JP] Japan .................................. 58-93219

[51] Int. Cl.$^4$ ...................... H01L 21/225; H01J 17/00
[52] U.S. Cl. .................................. 148/189; 148/186; 204/164; 427/39
[58] Field of Search ................ 148/189, 186; 204/164; 427/39

[56] References Cited

U.S. PATENT DOCUMENTS

| | | | |
|---|---|---|---|
| 3,949,119 | 4/1976 | Schewchun et al. ............... | 148/189 |
| 4,151,058 | 4/1979 | Kaplan et al. ......................... | 427/38 |
| 4,173,661 | 11/1979 | Bourdon ............................... | 427/39 |
| 4,331,486 | 5/1982 | Chenevas-Paule et al. .......... | 148/1.5 |
| 4,434,036 | 2/1984 | Hoerschelmann et al. ........ | 148/189 |
| 4,465,529 | 8/1984 | Arima et al. ......................... | 204/164 |
| 4,525,224 | 6/1985 | Vlasak ................................... | 148/189 |
| 4,540,647 | 9/1985 | Borsenberger ........................ | 427/39 |

FOREIGN PATENT DOCUMENTS 0045923  3/1982  Japan .................................. 148/189

Primary Examiner—Upendra Roy
Attorney, Agent, or Firm—Finnegan, Henderson, Farabow, Garrett & Dunner

[57] ABSTRACT

A method for adding impurities to a semiconductor base material comprises the steps of placing the base material in a vacuum chamber having an atmosphere containing the impurities as dopants, heating the base material to a temperature not exceeding 400° C., and causing a glow discharge in the vacuum chamber. The impurities are introduced as a gas containing, for example, diboron, phosphine, antimony, arsenic, gallium, or as an organic metal gas such as trimethyl gallium, trimethyl indium, or trimethyl aluminum. To cause the dopant atoms to become substitutional by assuming lattice positions, the base material may be subjected to a second glow discharge in an inert gas atmosphere.

13 Claims, 11 Drawing Figures

METHOD FOR ADDING IMPURITIES TO SEMICONDUCTOR BASE MATERIAL

BACKGROUND OF THE INVENTION

1. Technical Field

This invention relates to a method in which impurities as donors or acceptors are added to a semiconductor base material to form a region which is different in impurity density from the base material.

2. Prior Art and Difficulties

In order to form a semiconductor region of this type, a thermal diffusion method, an epitaxial growth method, or an ion implantation method has been employed. In each of the conventional methods, it is necessary to subject the semiconductor base material to a heat treatment of 800° to 1250° C. In such a high temperature treatment, crystal defects are formed in the semiconductor base material, and heavy metal elements from the heat treatment over are diffused in the semiconductor base material. This decrease the lifetime of carriers.

In addition, in the case of silicon having a high specific resistance of 10 kΩ-cm or higher, oxygen contained in the crystal acts as a donor with the result that the specific resistance is decreased. Thus, it is difficult to maintain the characteristics of the base material crystal unchanged.

These difficulties may be eliminated by decreasing the heat treatment temperature. However, if the temperature is merely decreased in the conventional methods, variation in the impurity density and diffusion depth of the semiconductor region is increased, and the reproducibility is lowered. For instance when the thermal diffusion method is employed, the coefficient of diffusion of impurities added to the semiconductor base material is so low that it is substantially impossible to perform thermal diffusion at 800° C. or lower.

Furthermore, it is considerably difficult to form an extremely thin semiconductor region, such as one less than 0.2 μm in depth near the surface of the base material by using the conventional methods. In order to form the extremely thin semiconductor region by the ion implantation method, it is necessary to set the accelerating voltage to 30 kV or to form an oxide film on the semicondutor base material and to implant impurity ions, as dopants, through the oxide film thereinto. However, in the former case, as the accelerating voltage is decreased, it becomes difficult to obtain the ion current and accordingly to obtain a high surface impurity density of $10^{21}$ to $10^{22}$ atoms/cm$^3$. In the latter case, variation in the thickness of the oxide film affects the surface impurity density and diffusion depth of the extremely thin semiconductor region, and it is therefore impossible to obtain an impurities-added layer having a surface impurity density of $10^{20}$ atoms/cm$^3$ or more. Thus, none of the methods is practical.

When a semiconductor radiation detecting element is manufactured by using a high purity, high specific resistance silicon element having a specific resistance of 10 kΩ-cm or higher, the high temperature treatment decreases the carrier life time of the semiconductor base material and lowers the S/N ratio. Moreover, if the surface doping region formed is more than 5 μm in thickness, the region insensitive to radiation is increased in thickness, thus lowering the detection sensitivity.

On the other hand, in order to form an impurities-added region in a noncrystalline semiconductor for use in the industrial field, a variety of methods has been proposed. In the most typical method of injecting, for instance boron elements, a monosilane gas (SiH$_4$) and a diboron gas (B$_2$H$_6$) are simultaneously supplied into a reaction chamber, and glow discharge is caused therein, to obtain a noncrystalline silicon doped with the boron elements. When the method is employed, a thin layer may be formed; however, it is substantially impossible to add boron impurities thereto to a density of $10^{21}$ atoms/cm$^3$ or more, and the specific resistance thereof cannot be decreased. Furthermore, when the two gases are supplied into the reaction chamber simultaneously, it is difficult to control the flow rates of the gases. Thus, the method is unsatisfactory in reproducibility.

OBJECTS AND SUMMARY OF THE INVENTION

Accordingly, an object of this invention is to provide a method of adding impurities to a semiconductor base material in which the above-described difficulties accompanying a conventional impurities adding method have been eliminated, and a semiconductor region having a predetermined electrical conductivity which is small in depth and high in surface impurity density is formed in the base material with high reproducibility.

The foregoing objects and other objects of the present invention have been achieved by a method of adding impurities to a semiconductor base material comprising the steps of placing a semiconductor base material in a vacuum chamber having an atmosphere containing predetermined impurities such as boron or phosphorus elements as dopants, heating the base material to 400° C. or less, and causing a glow discharge in the chamber so that a semiconductor region containing the impurities is formed in the base material.

In addition, these objects of the invention have been achieved by the provision of a method of adding impurities to a semiconductor base material comprising the steps of placing, the semiconductor base material into a vacuum chamber, heating the base material to a predetermined temperature, causing a glow discharge in the vacuum chamber in an atmosphere containing impurities provided to produce an impurities-added layer on the surface of the semiconductor base material, and causing the glow discharge again in an inert gas atmosphere in the chamber to change the impurities added prevsiouly into electrically active impurities.

BRIEF DESCRIPTION OF THE DRAWINGS

The nature, utility, and principles of the invention will be more clearly understood from the following detailed description and the appended claims when read in conjunction with the accompanying drawings, wherein:

DETAILED DESCRIPTION OF THE INVENTION

Figure 1:
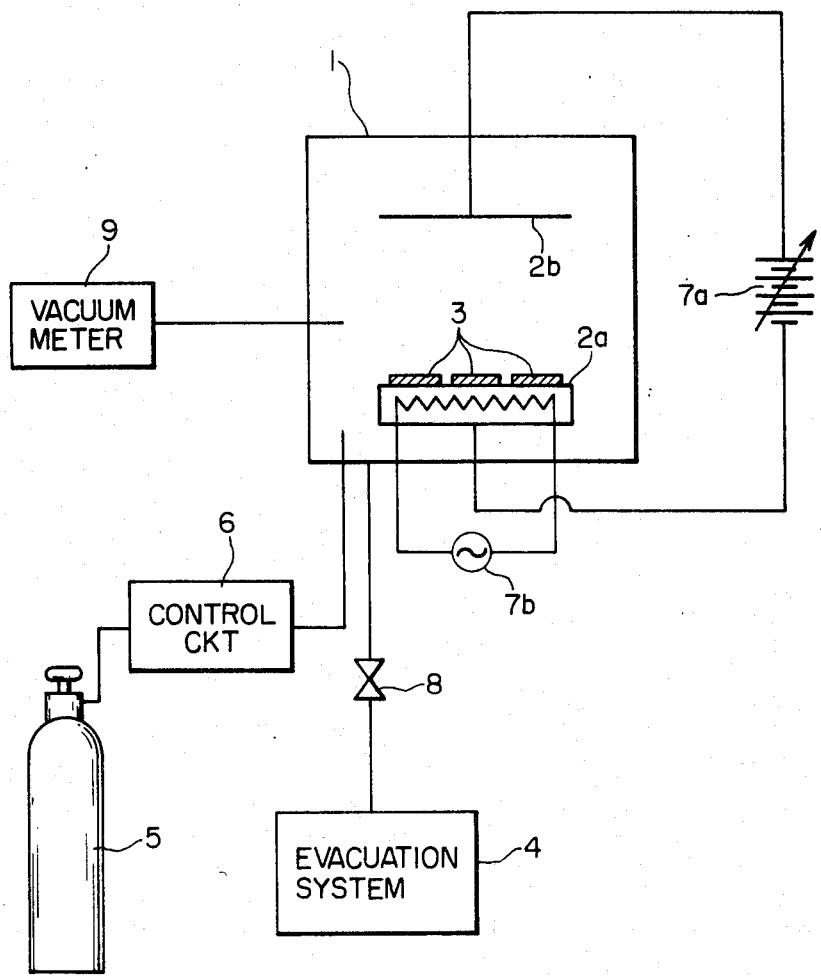
FIG. 1 illustrates an arrangement of one example of a reaction apparatus for practicing the method of the present invention.

A reaction apparatus for practicing a method of adding impurities to a semiconductor base material according to the present invention, as shown in FIG. 1, includes: a reaction chamber 1; electrodes 2a and 2b; a semiconductor base material 3; an evacuation system 4; a gas cylinder 5 containing impurities for forming semiconductor regions; a control circuit 6, such as mass flow meter, for controlling the pressure and flow rate of the impurity gas; a power source 7a for establishing a glow discharge; a power source 7b for heating the electrode 2a; and a vacuum valve 8 and a vacuum meter 9 which are used for controlling pressure during glow discharge.

First, the evacuation system 4 is operated to evacuate the reaction chamber 1 to about $1 \times 10^{-7}$ Torr. Then, the vacuum valve 8 is operated to reduce the rate of evacuation of the evacuation system 4, and simultaneously the impurity gas is introduced through the control circuit 6 into the chamber 1 until the pressure therein reaches 0.1 to 10 Torr. Under this condition, glow discharge is caused between the electrodes 2a and 2b in the conventional manner. As a result, a semiconductor region containing the impurities is formed in the semiconductor base material 3 laid on the electrode 2a which has been heated to 300° C. for instance.

EXAMPLE 1

Figure 2:
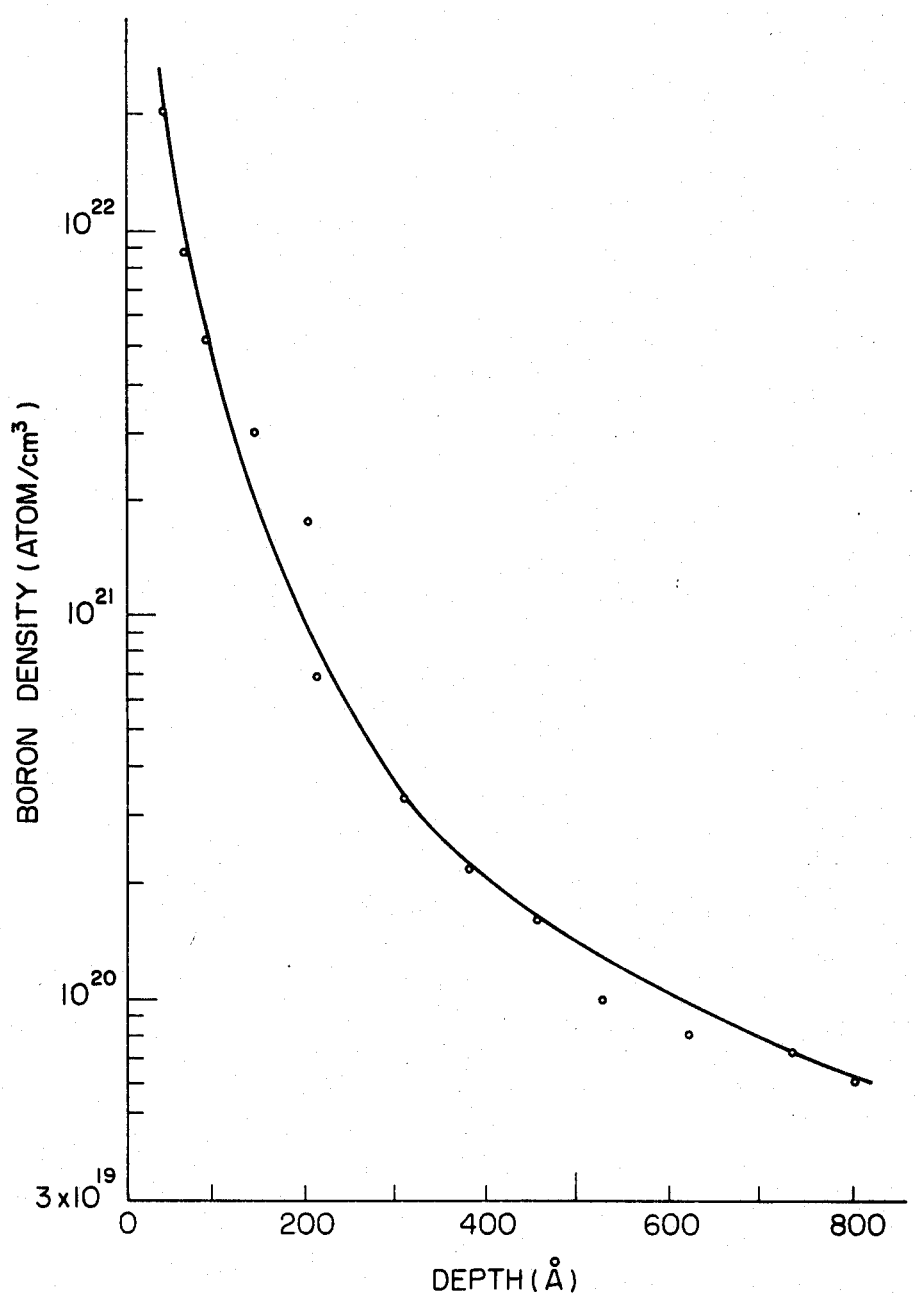
FIG. 2 is a graphical representation indicating the boron density distribution in one example in which a silicon single crystal is used as a semiconductor base material and boron impurities are used as dopants in the method of the present invention.

FIG. 2 is a graphical representation indicating a boron density distribution provided when a semiconductor region containing boron dopants has been formed by the method of the present invention in the base material 3 under the following conditions:

Base material: single crystal silicon, STET type, specific resistance 10 to 30 kΩ cm, mirror finish
Base material temperature: 300° C.

Dopant gas: diboron diluted with hydrogen to 1000 ppm
Pressure at glow discharge: 2.0 Torr
Discharge input: DC 600 V, 0.6 mA/cm$^2$
Interelectrode distance: 50 mm
Discharge time: 60 minutes In FIG. 2, the X-axis represents depths from the surface of the base material, and the Y-axis boron densities on a logarithmic scale. The boron density distribution was measured with an ion microanalyzer (IMA). In the IMA measurement, an ion beam sufficiently concentrated is applied to a specimen and secondary ions emitted by the specimen are introduced to a mass analyzer to detect mass-to-charge ratios and to achieve the element analysis of the specimen.

As is apparent from FIG. 2, the boron containing layer formed according to the present invention is an extremely thin region in which the surface impurity density is high, more than $10^{22}$ atoms/cm$^3$, and the density decreases to $10^{20}$ atoms/cm$^3$ at about 500 Å. In the case where the same boron containing layer is formed according to the ordinary diffusion method, the surface impurity density is less than $10^{21}$ atoms/cm$^3$ and the density decreases to $10^{20}$ atoms/cm$^3$ at a depth of more than 0.5 μm. Therefore, the boron containing layer formed according to the method of the present invention is an extremely thin p-type semiconductor region which is excellent in characteristic when compared with that which may be formed according to the ordinary diffusion method.

EXAMPLE 2

Figure 3:
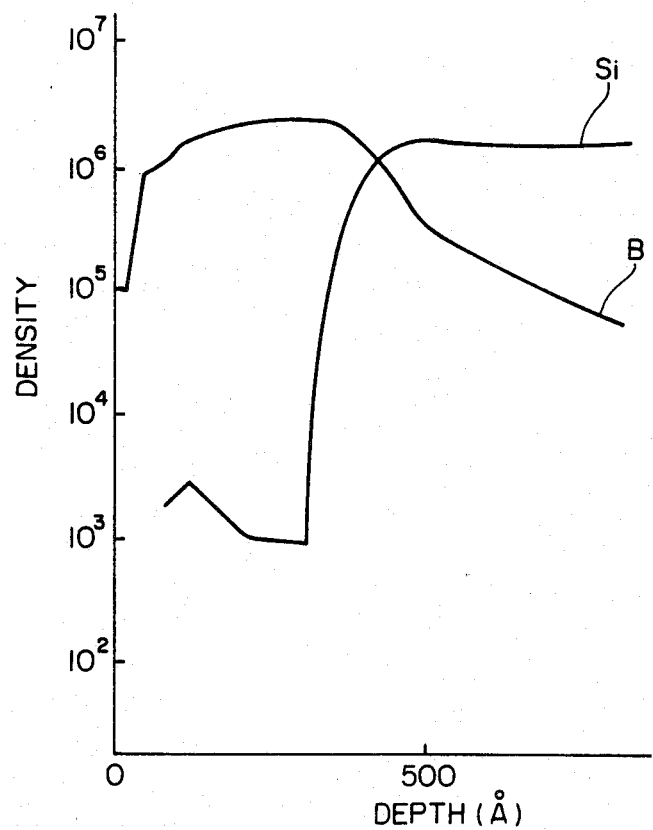
FIG. 3 is a graphical representation indicating a boron density distribution and a silicon density distribution in another example in which a boron film is formed on the surface of the base material according to the method of the present invention.
Figure 4:
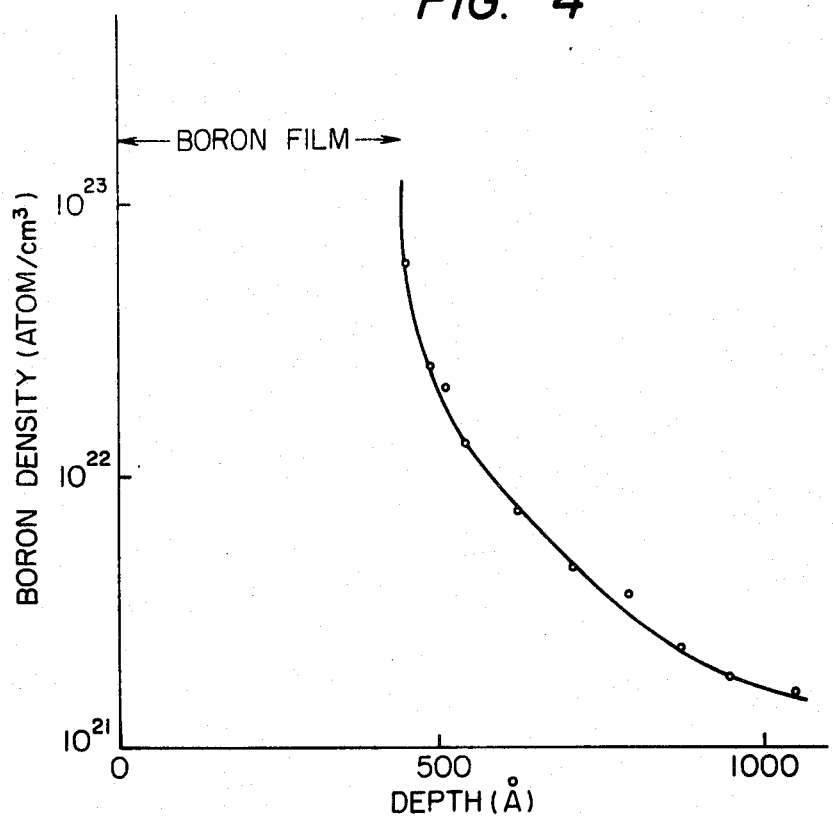
FIG. 4 is a graphical representation indicating a boron density distribution which is obtained through a boron density conversion based on the data in FIG. 3.
Figure 5:
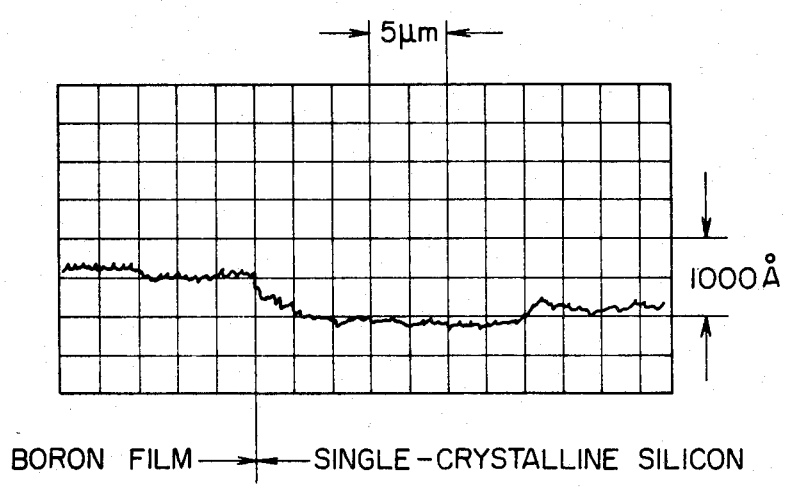
FIG. 5 is also a graphical representation indicating the thickness of a boron film which is measured with a surface roughness meter with a part of the boron film removed.

FIGS. 3, 4 and 5 indicate various data in example 2 employing a low discharge input voltage. In example 2, the same conditions as those in example 1 were employed except that the discharge input was set to DC 400 V. In example 2, a boron film was formed on a silicon single crystal. FIG. 3 is a graphical representation indicating a boron density distribution and a silicon density distribution with depths which were measured with the ion microanalyzer (IMA). In FIG. 3, the X-axis represents depth from the boron film surface, and the Y-axis the relative values of boron and silicon densities. As is clear from FIG. 3, the boron film formed on the silicon plate had a thickness of about 500 Å.

FIG. 4 is also a graphical representation indicating a boron density distribution similar to FIG. 2 which was obtained through a boron density conversion based on FIG. 3. As is apparent from FIG. 4, the boron density in the boron film is more than $10^{23}$ atoms/cm$^3$. Such a boron film can be removed by sputtering in an argon atmosphere. On the other hand, the boron film was subjected to sputter etching with a mask on it to form a step. The step thus formed was utilized to measure the boron film thickness with a surface roughness meter. The results of measurement are as indicated in FIG. 5. As is apparent from FIG. 5, the step between the boron film and the silicon plate is about 500 Å. The data in this direct method is substantially equal to the above-described IMA measurement result.

In example 2 also, an extremely thin p-type semiconductor region having a high surface impurity density similar to that in the case of FIG. 2 was obtained under the boron film. As in the above-described case, the boron film can be eliminated by sputter etching. Therefore, after the boron film has been removed, a passivation layer may be formed as required. However, since a boron film is extremely high in chemical resistance, the boron film may be kept on the semiconductor substrate as it is, so that it is used as a protective film against subsequent treatment, such as etching, of the substrate.

EXAMPLE 3

Figure 6:
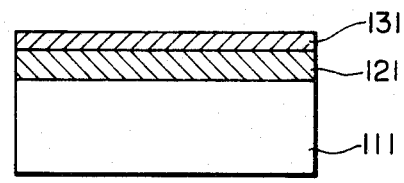
FIG. 6 is a sectional view of a semiconductor base material in an example in which boron impurities are added to a noncrystalline silicon layer by the method of the present invention.

A boron film was formed on the surface of the base material which was a noncrystalline silicon, and a boron interstitial layer was formed in the noncrystalline silicon base material immediately under the boron film. The base material was prepared by forming a non-doping non-crystalline silicon (a-Si) layer 121 about 1 μm in thickness on a silicon single crystal (c-Si) 111 having a high specific resistance as shown FIG. 6. The same process conditions as those in example 2 were employed.

Figure 7:
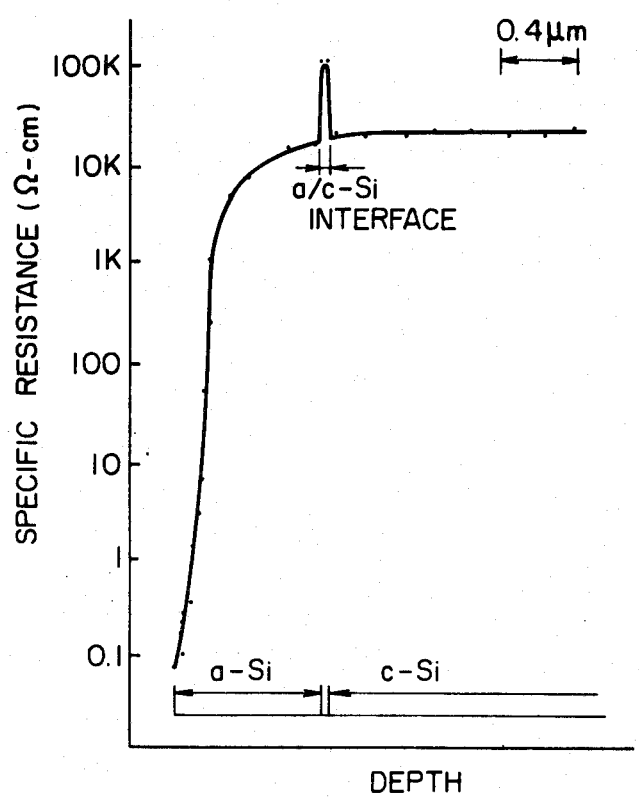
FIG. 7 is a graphical representation indicating a specific resistance distribution measured in the direction of depth of the base material.

As a result, a boron film 131 was formed on the non-crystalline silicon layer 121. FIG. 7 indicates specific resistances which were measured in the direction of depth of the base material shown in FIG. 6 according to a spreading resistance method. In FIG. 7, the X-axis represents depths from the base material surface, and the Y-axis specific resistances on a logarithmic scale.

As boron impurities were doped into the a-Si layer according to the method of the invention, the specific resistance of the non-doping a-Si layer was decreased to 0.1 Ω-cm. This means that the boron density is more than $10^{22}$ atoms/cm$^3$. As is apparent from FIG. 7, as the depth increases, the specific resistance is increased while the interstitial boron quantity is decreased.

EXAMPLE 4

Figure 8:
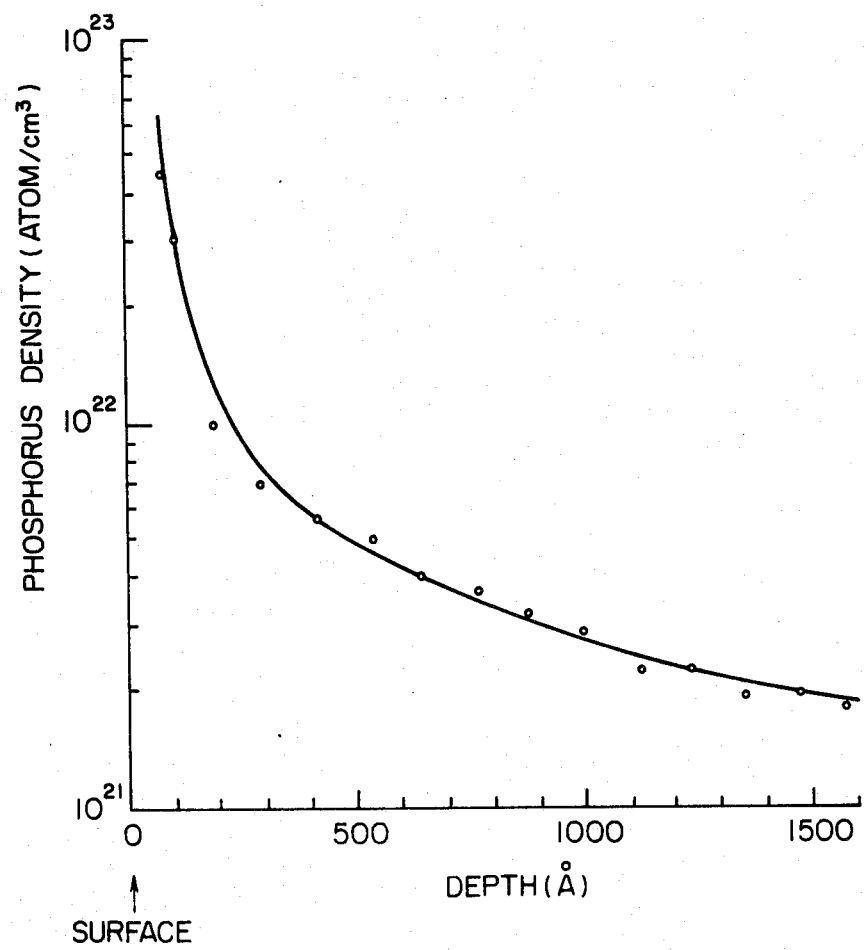
FIG. 8 is a graphical representation indicating a phosphorus density distribution in a base material in an example in which phosphorus impurities are added to a silicon single crystal by the method of the present invention.

In this example, phosphorus dopants were used, and instead of the diboron gas, a phosphine gas (PH$_3$) was used. Therefore, an n-type semiconductor region was formed. The conditions employed were as follows:

Base material: single crystal silicon, p-type, specific resistance 10 to 30 kΩ-cm, mirror-finished
Base material temperature: 300° C.
Dopant gas: phosphine diluted with hydrogen to 1000 ppm
Pressure at glow discharge: 2.0 Torr
Discharge power: DC 600 V, 0.6 mA/cm$^2$
Interelectrode distance: 50 mm
Discharge time: 60 minutes FIG. 8 shows the phosphorus density distribution of the n-type semiconductor region formed by the method of the present invention. As is apparent from FIG. 8, the region has a high surface impurity density of $10^{22}$ to $10^{23}$ atoms/cm$^3$ and is extremely thin, about 1500 Å.

In the above-described examples, the base material temperature was 300° C.; however, it may be lower than or higher than 300° C. However, in order to form a semiconductor region different in impurity density in a semiconductor base material in a short time without lowering the long life time and crystal perfection of the semiconductor base material, it is advantageous that the base material be heated to about 300° C., or 400° C. in maximum.

In the above-described examples, the dopants were of boron or phosphorus; however, it should be noted that the invention is not limited thereto or thereby. For instance, if a gas containing antimony, arsenic or gallium, or an organic metal gas such as trimethyl gallium gas, trimethyl indium gas or trimethyl aluminum gas is introduced into the vacuum chamber and a glow discharge is caused therein in accordance with the present invention, a semiconductor region containing impurities of gallium, indium or aluminum is formed in the semiconductor base material. Furthermore, if a gas containing antimony or arsenic is used, the element can be added to the base material.

The reason that impurities obtained by decomposition of the gas are added to an extremely thin region in the surface of a semiconductor base material according to the present invention has not been completely clarified yet. The reason may be that the glow discharge forms a thin region with a high temperature in the surface.

According to the method of the present invention, unlike the conventional methods requiring high temperature treatment, glow discharge is carried out in an atmosphere containing desired impurities, so that a semiconductor region containing the impurities is formed in a silicon, germanium or compound semiconductor base material. It should be noted that an extremely thin diffusion layer about 500 to 1500 Å in thickness or a high impurity density semiconductor region having a surface impurity density of $10^{21}$ to $10^{22}$ atoms/cm$^3$, which cannot be formed by the thermal diffusion method or the ion implantation method, can be formed according to the method of the present invention. Accordingly, in the method of the present invention, it is unnecessary to use an expensive ion implanting apparatus or diffusion oven, which contributes greatly to the cost in the manufacture of radioactive detecting elements.

Figure 9:
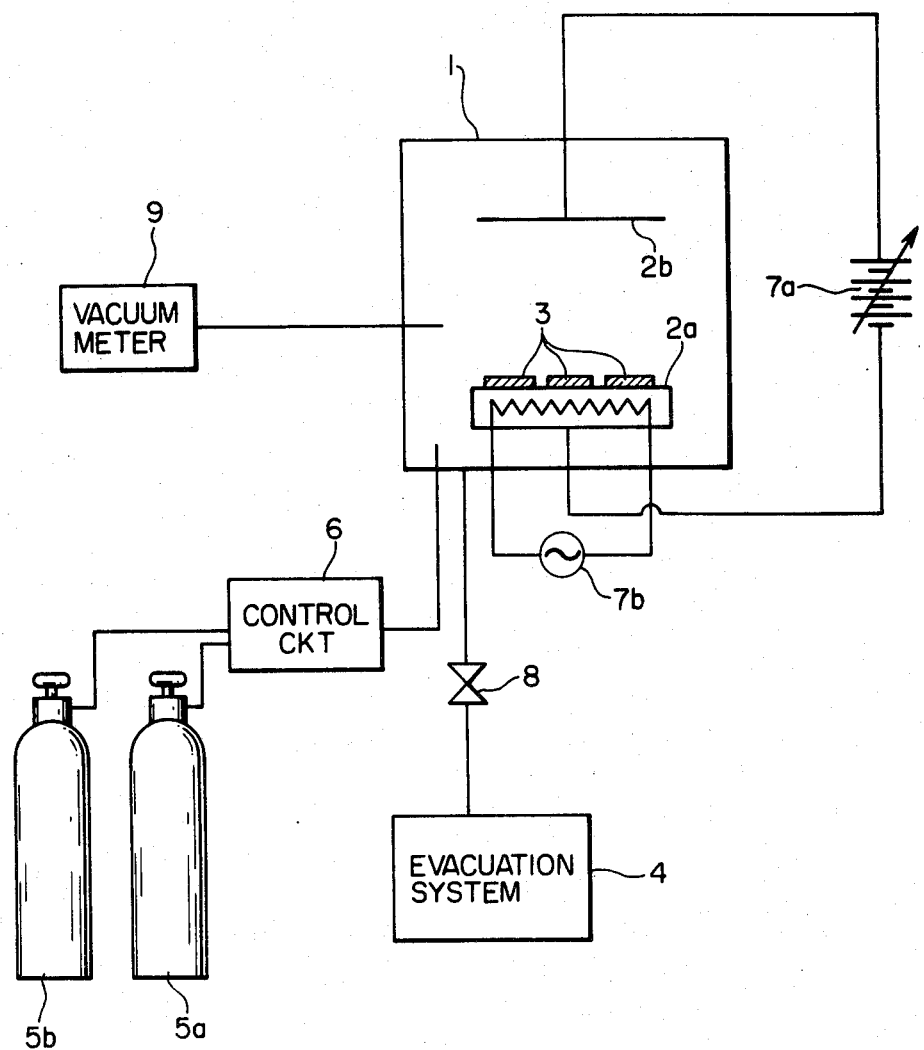
FIG. 9 is an explanatory diagram showing another example of a reaction apparatus for practicing the method of the present invention.

A reaction apparatus for practicing another example of the method of the present invention is as shown in FIG. 9. As is apparent from comparison between FIGS. 1 and 9, the reaction apparatus of FIG. 9 is different from that in FIG. 1 only in that the former has two gas cylinders, namely, a dopant gas cylinder 5a and an inert gas cylinder 5b.

The evacuation system 4 is operated to evacuate the chamber 1 to about $1 \times 10^{-7}$ Torr. Then, the vacuum valve 8 is operated to decrease the rate of evacuation of the evacuation system 4, and simultaneously the impurity gas is introduced through the control circuit 6 into the vacuum chamber 1. Under this condition, a voltage is applied to the electrodes 2a and 2b to cause a glow discharge therebetween in the conventional manner.

As a result, a semiconductor region containing the impurities is formed in the semiconductor base material 3 placed on the electrode 2a. Thereafter, a glow discharge is caused again, for instance, in an inert gas atmosphere of argon. The impurities added before are shifted from interlattice positions to substitutional positions with the advancement of glow discharge, so that the amount of electrically active impurities is increased.

Figure 10:
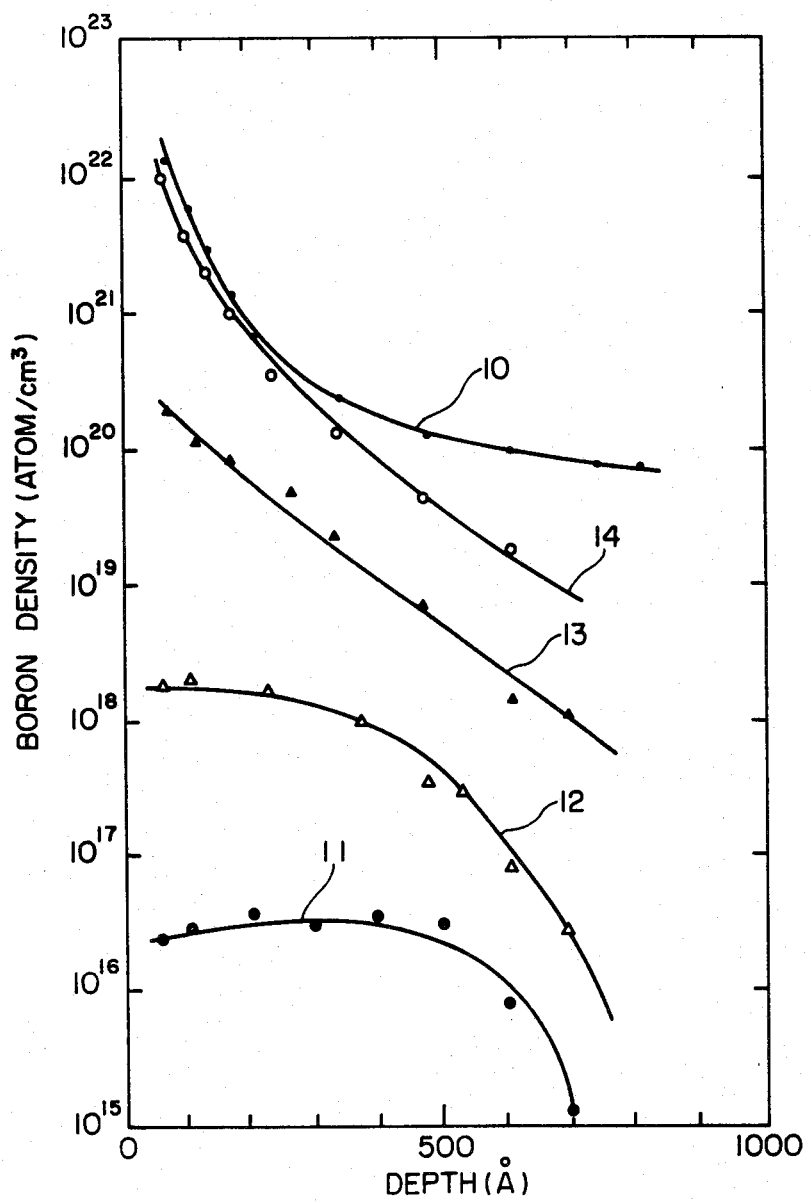
FIG. 10 is a graphical representation indicating impurities density distributions in the case where boron impurities are diffused as dopants by the method of the present invention.
Figure 11:
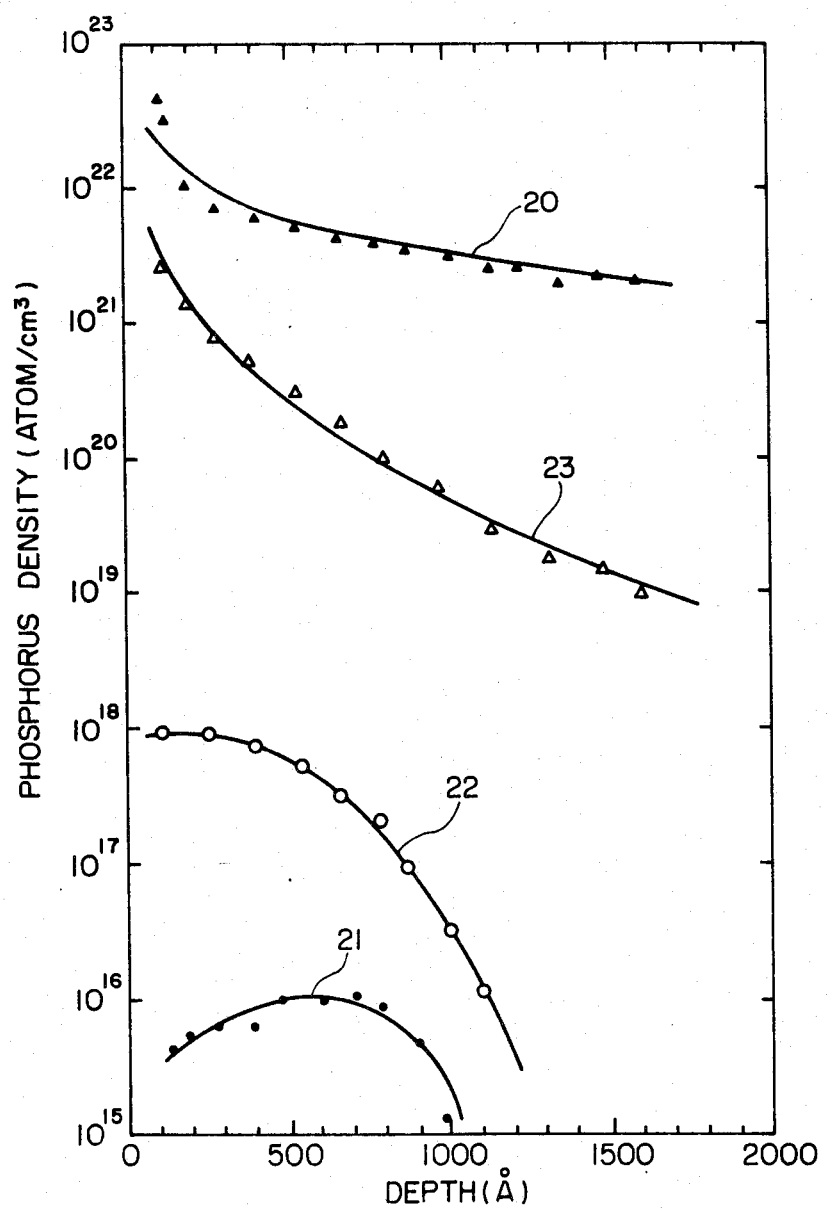
FIG. 11 is a graphical representation indicating impurities density distributions in the case where phosphorus impurities are diffused as dopants by the method of the present invention.

FIGS. 10 and 11 are graphical representations indicating impurity density distributions in examples produced by the second method of the present invention. In each of FIGS. 10 and 11, the X-axis represents depths from the surface of the semiconductor base material, and the Y-axis impurity densities. For measurements, the ion microanalyzer (IMA) and the spreading resistance method were employed. In the IMA measurement, a concentrated ion beam is applied to a specimen. Secondary ions emitted by the specimen are introduced to a mass analyzer to detect mass-to-charge ratios and, to achieve the element analysis of the specimen, as was described before. Therefore, the ion microanalyzer can detect electrically inactive impurities as well as electrically active impurities.

In the spreading resistance method, two measuring needles are brought into contact with the surface of a semiconductor, and the electrical resistance between the two needles is measured to obtain a specific resistance. Thus, in the spreading resistance method, only electrically active impurities are detected.

FIG. 10 shows the example in which boron impurities are added to a silicon single crystal substrate under the following conditions:

(1) Impurities adding conditions
Semiconductor base material: silicon, n-type, specific resistance 10 to 30 kΩ-cm, mirror finished
Base material temperature: 300° C.
Dopant gas: diboron diluted with hydrogen gas to 1000 ppm
Pressure at glow discharge: 2.0 Torr.
Discharge power: DC 400 to 600 V, 0.6 mA/cm$^2$
Interelectrode distance: 50 mm
Discharge time: 60 minutes (2) Electrical activation conditions
Inert gas: argon
Pressure at glow discharge: 0.1 Torr
Discharge power: DC 600 V, 0.6 mA/cm$^2$
Base material temperature: 100° to 300° C.
Discharge time: 120 to 360 minutes In FIG. 10, the curve 10 is an impurity density distribution obtained according to the IMA method, and the curve 11 is the density distribution of electrically active impurities obtained according to the spreading resistance method. These curve indicate the fact that most of the boron impurities, which are provided by decomposition of the diboron gas and are added to the silicon single crystal, occupy the interlattice positions of the silicon single crystal. The number of substitutional boron atoms occupying the lattice positions is less, with the result that the electrical conductivity is not improved greatly.

The curves 12, 13 and 14 are density distributions obtained according to the spreading resistance method after the silicon wafer was subjected to glow discharge in an argon atmosphere for 120 minutes, 240 minutes and 360 minutes, respectively. It can be understood from these curves that a semiconductor region having a desired surface density can be obtained by controlling the glow discharge time.

The example shown in FIG. 11 is different from the example shown in FIG. 10 in that instead of boron, phosphorus was diffused. In the example of FIG. 11, an STET-type semiconductor region was formed under the following conditions:

(1) Impurities adding conditions
Semiconductor base material: silicon, STET-type, specific resistance 10 to 30 kΩ-cm, mirror-finished
Reaction temperature: 300° C.
Dopant gas: phosphine diluted with hydrogen to 1000 ppm
Pressure at glow discharge: 2.0 Torr
Interelectrode distance: 50 mm
Discharge time: 60 minutes (2) Electrical activation conditions
Same as those in the example shown in FIG. 10.

In FIG. 11, the curve 20 is a phosphorus density distribution which was obtained according to the IMA method, and the curve 21 is the density distribution of electrically active phosphorus impurities obtained according to the spreading resistance method. The curves 22 and 23 are density distributions which were obtained according to the spreading resistance method after electrical activation was performed by glow discharge in an argon atmosphere for 120 minutes and 240 minutes, respectively. Thus, as in the case of FIG. 10, the density of electrically active phosphorus impurities increases with discharge time.

A method of performing glow discharge in an argon atmosphere as described above is called "a sputtering method." For instance, when argon ions strike a silicon surface, silicon atoms are emitted therefrom, to expose a new atom layer. Therefore, the sputtering method is used for purifying a crystal surface. In the glow discharge conditions employed in the present invention, the argon gas pressure is higher than that in the conventional sputtering method, and the accelerating voltage is lower. Therefore, boron atoms going into the silicon surface are knocked into the silicon single crystal and are not flipped by argon ions. The temperature of the silicon surface is increased locally. As a result, the dopant atoms at the interlattice positions are shifted to the lattice positions, thus becoming substitutional, which increases the electrical conductivity.

The examples have been described with reference to boron and phosphorus impurities. The invention is not limited thereto or thereby. For instance, if a semiconductor region doped with antimony, arsenic, gallium or aluminum impurities is subjected to glow discharge in an atmosphere of inert gas such as argon or helium gas, the electrical activity is increased. Furthermore, if a non-crystalline silicon film used for a photodetector or the like is subjected to glow discharge in an atompshere of impurity gas such as boron or phosphorus gas and is then subjected to glow discharge in an inert gas atmosphere, an extremely thin, P-N structure non-crystalline film having an impurity layer lower in specific resistance.

As is apparent from the above description, in the second methods of the present invention, impurities are added to a single crystal or non-crystalline semiconductor base material at a relatively cool temperature of 300° C. or lower. First, impurities are added to the base material by causing glow discharge in the impurity gas atmosphere, and glow discharge is caused again in the atmosphere of inert gas such as argon gas. As a result, an electrically active impurities-doped layer having a desired surface impurity density in the range of $10^{16}$ to $10^{22}$ atoms/cm$^3$ and a depth smaller than 1500 Å can be obtained as was described above.

That is, a semiconductor region extremely small in thickness and high in surface impurity density, which the thermal diffusion method and the ion implantation method cannot provide, can be obtained according to the methods of the present invention. If the methods of the present invention are applied to the manufacture of radiation detecting elements, not on a region such as a p-n junction layer insensitive to radiation can be made thin, but also the characteristics of the crystal can be maintained unchanged because of the low temperature treatment. The S/N ratio will be increased and the energy resolution will be improved.

In the case of a photodetector using noncrystalline silicon, in forming the impurities-doped layer, it is unnecessary to perform the conventional operation of supplying silane gas and dopant gas in an optimum mixture ratio to the reaction chamber. Instead, only the dopant gas is supplied thereto to cause glow discharge therein and glow discharge is caused again in the inert gas atmosphere. Therefore, the method of the present invention can provide an impurities-doped layer low in specific resistance and extremely small in thickness which substantially cannot be obtained by the conventional methods.

For planar type elements or MOSIC elements, the above-described methods provide significant beneficial effects in that variations in characteristics due to high temperature treatment, such as pollution of the oxide film and variations in junction depth, are decreased. Furthermore, the methods of the present invention can provide an extremely thin diffusion layer, or a semiconductor region high in surface impurity density, which cannot be obtained by the thermal diffusion method or the ion implantation method.

It should be understood that the present invention is not limited to the particular methods described but is subject to modifications, attenuations, and equivalences within the scope of the appended claims.

What is claimed is:

1. A method of adding impurities to a semiconductor base material comprising the steps of:
   placing the semiconductor base material in a vacuum chamber;
   evacuating said vacuum chamber to a pressure of approximately $1 \times 10^{-7}$ Torr after the semiconductor base material has been placed in said chamber;
   pressurizing said chamber with a gas containing the impurities until the pressure in said chamber reaches 0.1 to 10 Torr, inclusive;
   heating the semiconductor base material to a temperature not exceeding 400° C.; and
   causing a glow discharge in said vacuum chamber.

2. A method according to claim 1 wherein said step of pressurizing includes introducing a gas containing diboron, phosphine, antimony, arsenic, gallium or an organic metal gas such as trimethyl gallium, trimethyl indium, or trimethyl aluminum.

3. A method according to claim 1 wherein said heating step comprises heating the semiconductor base material to a temperature between 100° C. and 400° C., inclusive.

4. A method according to claim 1 wherein said heating step comprises heating the semiconductor base material to approximately 300° C.

5. A method according to claim 1 wherein said step of causing a glow discharge comprises placing the semiconductor base material between an anode and cathode within said chamber and applying a voltage across said anode and said cathode.

6. A method of adding impurities to a base material comprising the steps of:
   placing the base material in a vacuum chamber having an atmosphere containing the impurities as dopants;
   heating the base material to temperature not exceeding 400° C.;
   causing a first glow discharge in said vacuum chamber;
   establishing an inert atmosphere in said vacuum chamber; and
   causing a second glow discharge in said vacuum chamber.

7. A method according to claim 6 wherein said step of placing includes the steps of:
   evacuating said vacuum chamber to a pressure of approximately $1 \times 10^{-7}$ Torr. after the base material has been placed in said chamber; and
   pressurizing said chamber with a gas containing the impurities until the pressure in said chamber reaches 0.1 to 10 Torr., inclusive.

8. A method according to claim 6 wherein said heating step comprises heating the base material to a temperature between 100° C. and 400° C., inclusive.

9. A method according to claim 6 wherein said heating step comprises heating the base material to approximately 300° C.

10. A method according to claim 6 wherein said step of causing a glow discharge comprises placing the base material between an anode and cathode within said chamber and applying a voltage across said anode and said cathode.

11. A method according to claim 6 wherein said step of establishing an inert atmosphere in said vacuum chamber comprises the steps of:
    evacuating the atmosphere in vacuum chamber; and
    pressurizing said vacuum chamber with an atmosphere containing an inert gas.

12. A method according to claim 7 wherein said step of pressurizing includes introducing a gas containing diboron, phosphine, antimony, arsenic, gallium or an organic metal gas such as trimethyl gallium, trimethyl indium, or trimethyl aluminum.

13. A method according to claim 11 wherein said step of pressurizing said vacuum chamber with an atmosphere containing an inert gas includes introducing argon gas under pressure into said chamber until the pressure therein reaches 0.1 to 10 Torr.

* * * * *